(12) United States Patent
Kobayashi et al.

(10) Patent No.: US 6,416,912 B1
(45) Date of Patent: Jul. 9, 2002

(54) METHOD OF MANUFACTURING MICRODEVICE UTILIZING COMBINED ALIGNMENT MARK

(75) Inventors: Mitsuru Kobayashi, Kawasaki; Ryoichi Kaneko, Yokohama, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/699,154

(22) Filed: Oct. 27, 2000

Related U.S. Application Data

(63) Continuation of application No. PCT/JP99/02268, filed on Apr. 28, 1999.

(30) Foreign Application Priority Data

Apr. 28, 1998 (JP) ............................................ 10-118831

(51) Int. Cl.[7] .............................. G03F 9/00; G03C 5/00
(52) U.S. Cl. .......................................... 430/22; 430/30
(58) Field of Search ..................................... 430/22, 30

(56) References Cited

U.S. PATENT DOCUMENTS

| | | | |
|---|---|---|---|
| 5,493,403 A | 2/1996 | Nishi | .......................... 356/401 |
| 5,532,091 A | 7/1996 | Mizutani | ...................... 430/22 |
| 5,657,129 A | 8/1997 | Nishi | .......................... 356/401 |

FOREIGN PATENT DOCUMENTS

| | | | |
|---|---|---|---|
| JP | 57-112021 A | 7/1982 | ........... H01L/21/30 |
| JP | 60-074435 A | 4/1985 | ........... H01L/21/30 |
| JP | 02-142110 A | 5/1990 | ......... H01L/21/027 |
| JP | 02-294015 A | 12/1990 | ......... H01L/21/027 |
| JP | 07-142326 | 6/1995 | ......... H01L/21/027 |

*Primary Examiner*—Christopher G. Young
(74) *Attorney, Agent, or Firm*—Synnestvedt & Lechner LLP

(57) ABSTRACT

An exposure apparatus for accurately and quickly transferring mask patterns to a substrate on which a plurality of pattern layers are formed, and a method of manufacturing microdevices that uses the exposure apparatus. A wafer mark (or substitute wafer mark) of a gate electrode layer and a wafer mark of a second interlayer insulating layer are formed on a street line of a wafer. Mark bars WMnm (n=1, 2, M-1 to 4) of the wafer marks are alternately arranged, and combined marks are formed. The combined marks are simultaneously detected with an alignment system, and positional information of the wafer marks is computed based on the detection results. Then, the circuit patterns on a reticle are aligned with a shot region on the wafer based on the computed positional information.

11 Claims, 8 Drawing Sheets

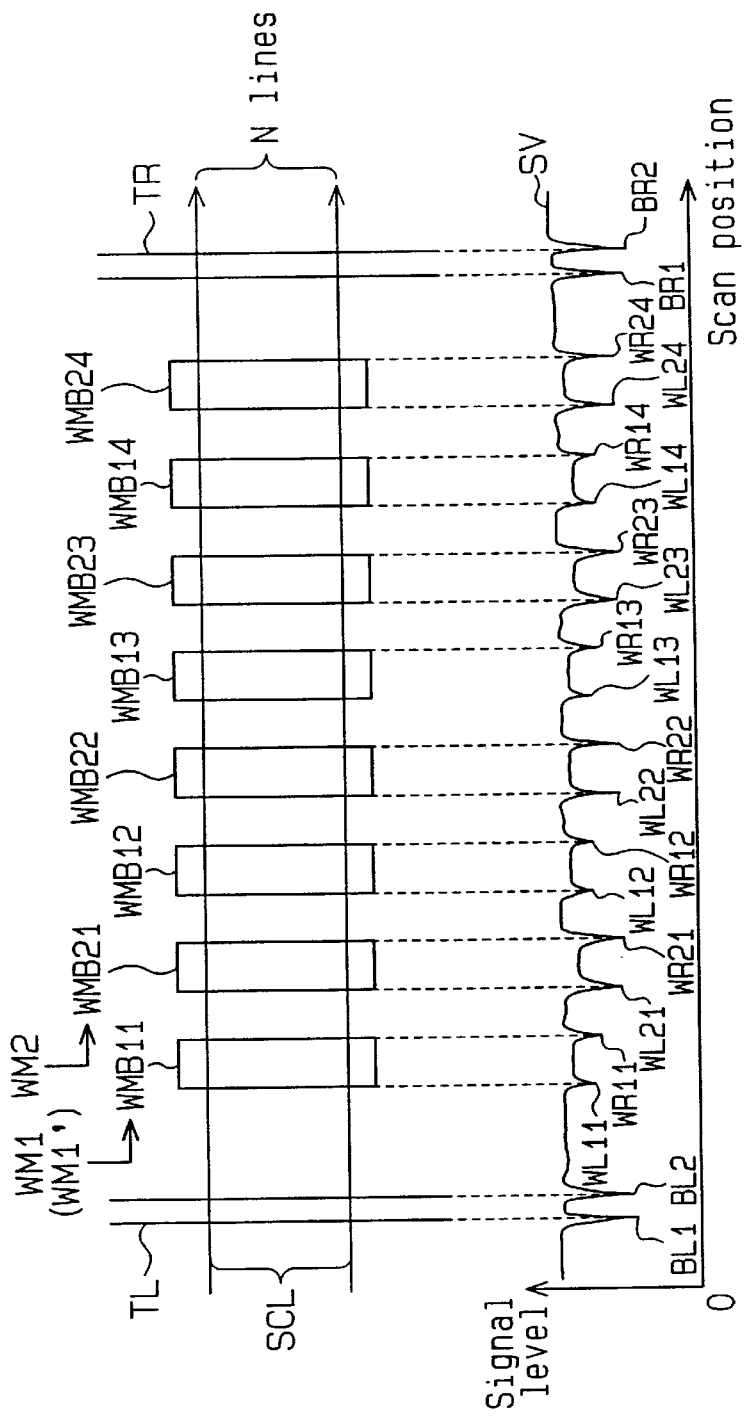

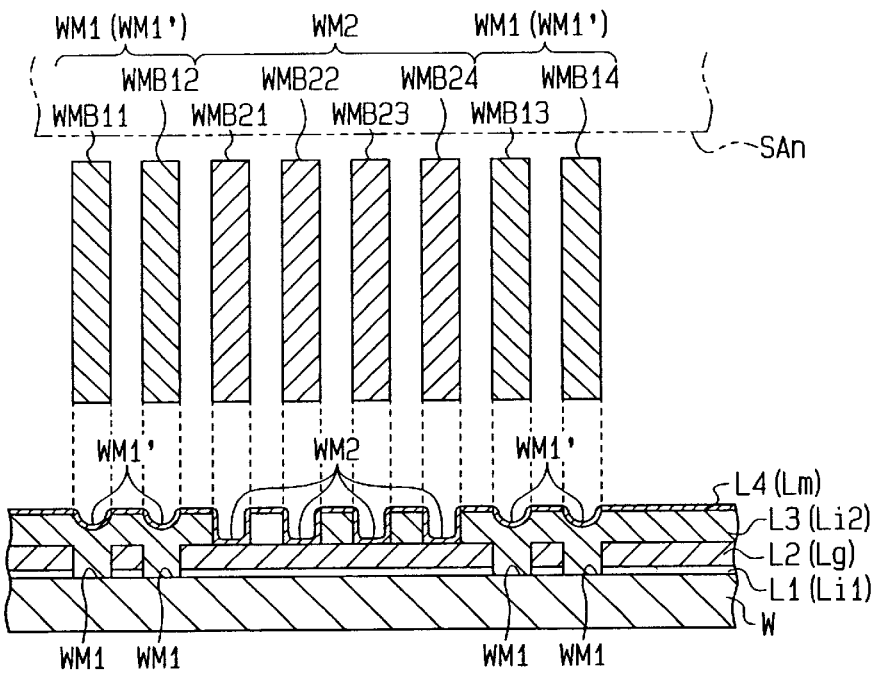
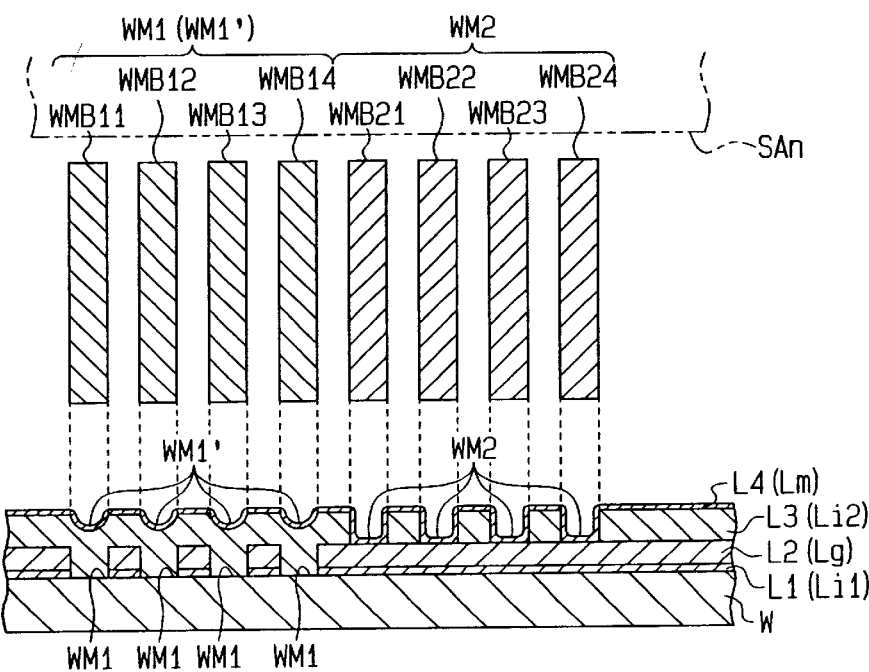

METHOD OF MANUFACTURING MICRODEVICE UTILIZING COMBINED ALIGNMENT MARK

RELATED APPLICATION

This application is a continuation of PCT application number PCT/JP99/02268 filed on Apr. 28, 1999.

BACKGROUND OF THE INVENTION

The present invention relates to an exposure apparatus, and, more particularly, to an exposure apparatus that is used in manufacturing a microdevice and transfers a plurality of patterns to a substrate in an overlapping manner, and a method of manufacturing a microdevice, which uses the exposure apparatus.

Conventionally, an exposure apparatus is used in the photolithography step of a microdevice manufacturing process, such as a semiconductor device, a liquid crystal display device, a thin film magnetic head and an image pickup device. The exposure apparatus transfers a pattern formed on a mask, such as a reticle or photomask, to a predetermined area on a substrate, such as a wafer or a glass plate, on which a photosensitive material like a photoresist is coated. The following will describe, as one example, an exposure apparatus for fabrication of semiconductor devices, which transfers a pattern on a reticle to a predetermined shot area on a wafer.

For this type of exposure apparatus, a one-shot exposure type exposure apparatus of a step and repeat system is frequently used. In the step and repeat system, patterns on a reticle are sequentially transferred to individual shot areas on a wafer via a projection optical system while moving the wafer step by step (stepping). Recently, a scanning aligning type exposure apparatus of a step and scan system has been developed. In the step and scan system, a reticle and a wafer are scanned synchronously, thus ensuring projection transfer to a wider area than the exposure field of the projection optical system.

A semiconductor device is formed by stacking multiple circuit pattern layers on a wafer. At the time of executing projection transfer of circuit patterns of the second and subsequent layers to the wafer, it is necessary to accurately align the shot area of a circuit pattern already formed on the wafer with the pattern image of the reticle (i.e., to align the wafer with the reticle).

The conventional exposure apparatus (particularly of the step and repeat system) has a reticle alignment system for detecting a position concerning the reticle and a wafer alignment system for detecting positions concerning wafer marks formed on the individual layers on the wafer. When a reticle is placed in the exposure apparatus, the reticle is positioned in a predetermined position based on the detection result of the reticle alignment system. At the time of transferring the pattern of an N-th layer, for example, the alignment system detects the position of a wafer mark on an immediately previous or (N−1) layer. An offset value to the center of a shot area is added to the positional information of the wafer mark and the shot area is arranged at a reference position such that the center of the shot area coincides with the center of the exposure field of the projection optical system, and the pattern of the reticle is exposed.

When there is a circuit pattern layer on which a wafer mark is not formed, the position of a wafer mark on a layer which is located before the layer having no wafer mark and on which a latest wafer mark is formed (hereinafter called "immediately previous mark layer") is detected. In the case where alignment is carried out using a wafer mark on the immediately previous mark layer as a reference, however, a slight alignment error (the amount of a positional deviation) that is produced at the time of alignment is added as more layers are stacked on the wafer. This accumulation of errors is problematic in that the positional deviation increases with successive or higher layers.

Further, in a semiconductor device, related patterns should not necessarily be formed on adjoining layers. That is, the N-th pattern and the (N−2) pattern may be electrically connected by a contact hole. In such a case, the amount of positional deviation between the N-th pattern and the (N−2) pattern should be kept to a minimum. According to the conventional exposure apparatus, however, the (N−1) pattern is aligned using the (N−2) pattern as a reference and the N-th pattern is aligned using the (N−1) pattern as a reference. This causes alignment errors among a plurality of layers to be added, so that the alignment precision between related layers is effected.

To overcome this problem, Japanese Unexamined Patent Publication No. 7-249558 and corresponding U.S. Pat. No. 5,532,091 disclose the following alignment method. Assume that a plurality of pattern layers respectively having alignment marks have already been formed on a wafer. When there are patterns in those plurality of patterns which are related to a mark pattern to be transferred next, alignment marks of the related pattern layers are detected. Then, a predetermined exposure area and a mark pattern to be transferred are aligned with each other based on the coordinate values of the alignment marks.

To position individual shot areas on the wafer using the X axis and Y axis that are defined on the wafer surface and perpendicular to each other, a wafer mark for the X axis and a wafer mark for the Y axis are needed for each shot area. According to the aforementioned alignment method, the wafer marks on a plurality of layers are formed to extend two-dimensionally on the surface of the wafer. At the time of executing alignment, therefore, it is necessary to individually measure wafer marks on a plurality of related layers while moving the wafer in the X-axial direction or the Y-axial direction. That is, it is necessary to perform an alignment operation in the X-axial direction or the Y-axial direction for each layer, and further, movement of the wafer is performed during each alignment operation. As apparent from the above, the aforementioned alignment method has a problem such that the time needed for alignment increases, which lowers the throughput.

When the methods of forming the individual pattern layers differ from one another, the cross-sectional shapes of the wafer marks of the individual pattern layers may differ from one another. Such a variation in the cross-sectional shape of a wafer mark impacts an image pickup signal waveform. Further, there is a difference in optical characteristic between the individual pattern layers, such as reflectance, and this difference also causes the image pickup signal waveform to change.

The exposure apparatus measures the position of each wafer mark by observing each wafer mark using the image pickup device of an alignment system and processing the image pickup signal from the image pickup device with a main control system. Here, even though the image pickup signal waveform is varied, the main control system performs the same processing to measure the position of each wafer mark without considering a difference between the signal waveforms. In this case, the measuring result includes an error originated from a variation in signal waveform. This error hinders the accurate alignment of the exposure field of the projection optical system with each shot area.

SUMMARY OF THE INVENTION

It is an object of the present invention to provide an exposure apparatus that accurately and quickly transfers mask patterns to a substrate on which a plurality of pattern layers are formed, and a method of manufacturing a microdevice, that uses the exposure apparatus.

According to a first aspect of this invention, there is provided an exposure apparatus comprising a mark-position detecting mechanism which detects positional information of marks on a substrate on which a plurality of layers have been formed, and which transfers a pattern formed on a mask to overlap at least one of the patterns respectively formed on the plurality of layers based on detection results of the mark-position detecting mechanism. The mark-position detecting mechanism includes a one time detection mechanism which simultaneously detecting a first mark formed on a first layer on the substrate and a second mark formed on a second layer different from the first layer on the substrate. A positional information computing device is electrically connected to the one time detection mechanism and computes positional information of the first mark and positional information of the second mark based on the detection results of the one time detection mechanism. The pattern on the mask is aligned with a predetermined exposure area on the substrate based on at least one of the positional information of the first mark and the positional information of the second mark computed by the positional information computing device.

According to a second aspect of this invention, there is provided an exposure apparatus which transfers a pattern formed on a mask to a substrate. The apparatus includes a one time detection mechanism which simultaneously detects a first mark formed on the substrate and a second mark formed on a second surface different from a first surface on which the first mark is formed. A positional information computing device is electrically connected to the one time detection mechanism, corrects a signal corresponding the first mark and a signal corresponding to the second mark, which are detected by the one time detection mechanism, to signals having substantially equivalent waveforms and computes positional information of each mark.

According to a third aspect of this invention, there is provided an exposure apparatus which transfers a pattern formed on a mask to a substrate. The apparatus includes a one time detection mechanism which simultaneously detects a first mark formed on the substrate and a second mark formed on a second surface different from a first surface on which the first mark is formed. A processing unit is electrically connected to the one time detection mechanism and processes a signal corresponding the first mark and a signal corresponding to the second mark, which are detected by the one time detection mechanism, under processing conditions different from each other.

According to a fourth aspect of this invention, there is provided a method for detecting positional information of marks on a substrate on which a plurality of layers have been formed and for transferring a pattern formed on a mask to overlap at least one of the patterns respectively formed on the plurality of layers based on the positional information of marks. First, a first mark formed on a first layer on the substrate and a second mark formed on a second layer different from the first layer on the substrate are simultaneously detected. Then, positional information of the first mark and positional information of the second mark is computed based on signals obtained by the simultaneous detection step. The pattern on the mask is aligned with a predetermined exposure area on the substrate based on at least one of the computed information of the first mark and the computed positional information of the second mark.

According to a fifth aspect of this invention, there is provided an exposure method for transferring a pattern formed on a mask to a substrate. First, a first mark formed on the substrate and a second mark formed on a second surface different from a first surface on which the first mark is formed are simultaneously detected. Then, a signal corresponding the first mark and a signal corresponding to the second mark, which are detected by the one time detection mechanism, are corrected to signals having substantially equivalent waveforms to compute positional information of each mark.

According to a sixth aspect of this invention, there is provided an exposure method for transferring a pattern formed on a mask to a substrate. First, a first mark formed on the substrate and a second mark formed on a second surface different from a first surface on which the first mark is formed are simultaneously detected. Then, a signal corresponding the first mark and a signal corresponding to the second mark, which are detected by the one time detection mechanism, are processed under processing conditions different from each other.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5(*a*) is a diagram showing an image formed by an image pickup device of the alignment system and FIG. 5(*b*) is a waveform diagram of an image pickup signal of the image in FIG. 5(*a*);

FIG. 6(*b*) is a diagram showing the image of a wafer mark in FIG. 6(*a*) observed by the image pickup device and FIG. 6(*c*) is a waveform diagram of an image pickup signal of the image in FIG. 6(*b*);

FIG. 7(*b*) is a waveform diagram of an image pickup signal of a wafer mark in FIG. 7(*a*) and FIG. 7(*c*) is an enlarged diagram of the image pickup signal in FIG. 7(*b*);

FIG. 8(a) is a plan view illustrating a first modification of the layout of wafer marks in a combined mark, and FIG. 8(b) is a cross-sectional view of a wafer including the combined mark in FIG. 8(a);

FIG. 8(c) is a plan view illustrating a second modification of the layout of wafer marks in a combined mark, and FIG. 8(d) is a cross-sectional view of a wafer including the combined mark in FIG. 8(c);

DETAILED DESCRIPTION OF THE PREFERRED EMBODIMENT

Referring to FIGS. 1 to 7, a description will be given below of one embodiment of the present invention as embodied in a step and repeat one-shot exposure type exposure apparatus.

To begin with, the general structure of a stepper will be discussed. It is to be noted that as shown in FIG. 1, a direction parallel to the optical axis AX of a projection optical system 24 to be discussed later is the Z-axial direction, a direction parallel to the sheet surface in FIG. 1 within a plane perpendicular to the optical axis AX is the X-axial direction and a direction perpendicular to the sheet surface is the Y-axial direction.

Figure 1:
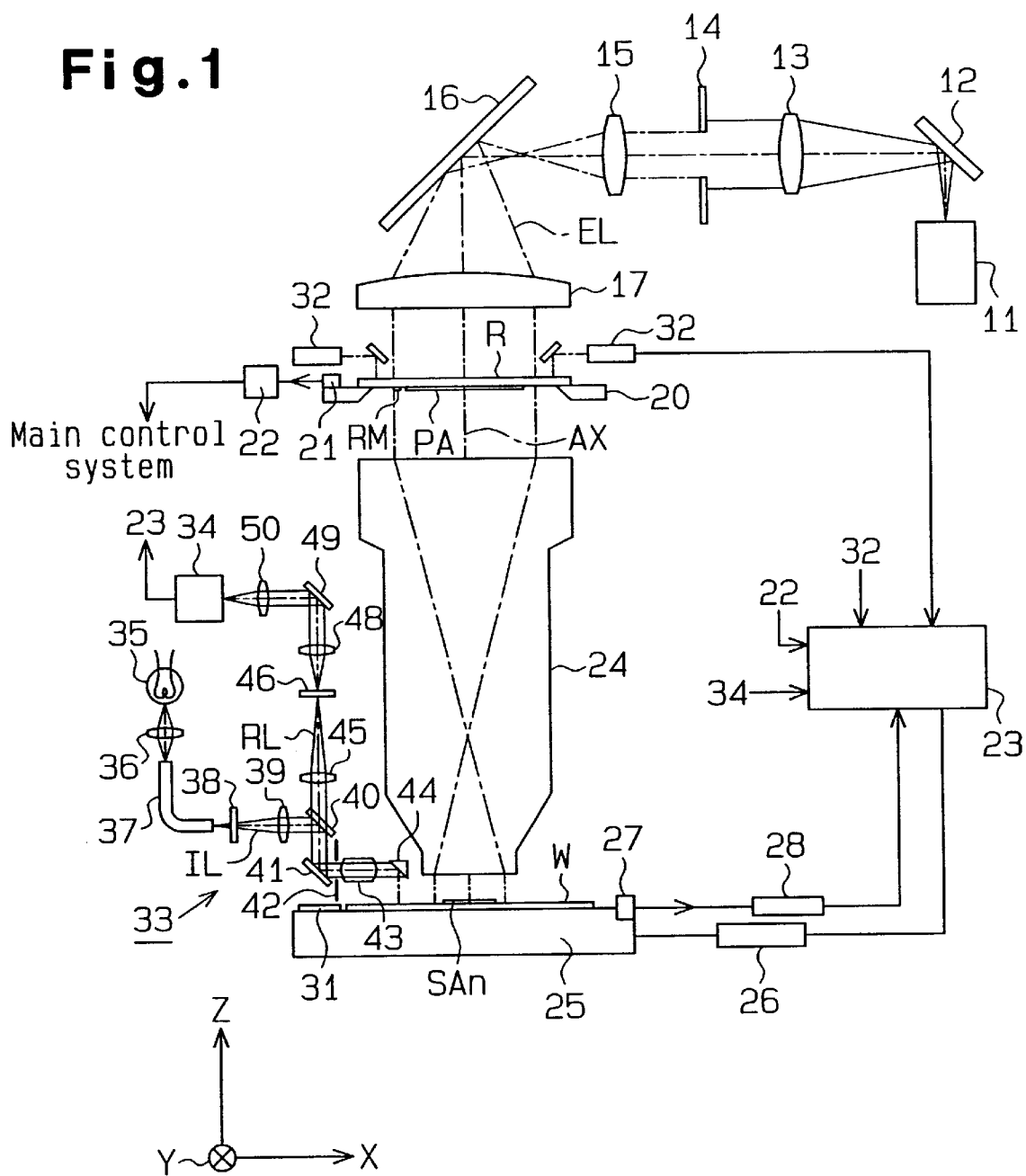
FIG. 1 is a schematic diagram of a one-shot exposure type exposure apparatus according to one embodiment of this invention.

As shown in FIG. 1, most of exposure light EL emitted from an illumination optical system 11 is reflected at a beam splitter 12. The illumination optical system 11 includes exposure source, collimator lens, interference filter, fly-eye lens (or rod integrator) as an optical integrator (homogenizer), and aperture stop (σ stop), etc, which are not illustrated. As the exposure light EL, for example, bright rays (g rays, h rays, i rays or the like) from a mercury lamp, a laser beam such as an excimer laser (KrF excimer laser, ArF excimer laser, $F_2$ laser, $Ar_2$ laser or the like), or harmonics of a metal vapor laser or a YAG laser or the like can be used.

The exposure light EL reflected by the beam splitter 12 is guided to a mirror 16 via a first relay lens 13, a variable field stop (reticle blind) 14 and a second relay lens 15. The exposure light EL is reflected downward generally perpendicularly by the mirror 16, and illuminates a pattern area PA of a reticle R as a mask placed on a reticle stage 20 with nearly uniform illuminance via a main condenser lens 17. The reticle blind 14 is arranged at a position conjugate to the pattern forming surface of the reticle R. Accordingly, the illumination view field on the reticle R can be set by changing the size and shape of the opening of the reticle blind 14.

The reticle stage 20 is arranged to be two-dimensionally movable on the X-Y plane perpendicular to the optical axis AX of the projection optical system 24 and slightly rotatable about the optical axis. Movable mirrors 21 are respectively attached to the X-axial directional and Y-axial directional ends of the reticle stage 20. Laser interferometers 22 are arranged in the vicinity of the reticle stage 20 to respectively face those movable mirrors 21. The movable mirrors 21 and laser interferometers 22 detect the X-axial directional and Y-axial directional positions of the reticle stage 20 and the amount of rotation (yawing amount) in the X-Y plane, and detection signals are input to a main control system 23 that controls the operation of the entire stepper.

The exposure light EL that has passed the pattern area PA of the reticle R enters the projection optical system 24 telecentric to both sides (or one side). A circuit pattern on the reticle R is projected, via the projection optical system 24, onto a single shot area SAn on the surface of a substrate or wafer W on a wafer stage 25 while being reduced by a predetermined reduction magnification (e.g., ⅕ or ¼). The wafer W is preferably held by vacuum chuck. A photosensitive material such as a photoresist which is photosensitive to the wavelength range of the exposure light EL is applied to the surface of the wafer W, thus forming a photosensitive layer.

The wafer stage 25 can move the wafer W closer to and away from the projection optical system 24, i.e., it is movable and tiltable in the X-axial direction, so that the surface of the wafer W substantially coincides with the optimal image forming surface of the projection optical system 24. The wafer stage 25 is constructed to allow two-dimensional stepping by a drive unit 26. Every time the transfer exposure of a circuit pattern of the reticle R with respect to a single shot area SAn on the wafer W is completed, therefore, the wafer stage 25 is stepped so that the next shot area SAn is moved into the exposure field of the projection optical system 21. Then, the projection transfer of circuit patterns on the reticle R to the individual shot areas SAn on the wafer W is repeated in accordance with the step and repeat system.

Further, movable mirrors 27 are respectively attached to the X-axial directional and Y-axial directional ends of the wafer stage 25, and laser interferometers 28 are arranged in the vicinity of the wafer stage 25 to respectively face those movable mirrors 27. The movable mirrors 27 and laser interferometers 28 detect the X-axial directional and Y-axial directional positions of the wafer stage 25 and the amount of rotation (yawing amount, pitching amount and rolling amount), and detection signals are input to the main control system 23.

Further, a reference plate 31 having a reticle alignment reference mark (RA reference mark) is provided on the wafer stage 25. The RA reference mark is used to detect the reference position for transfer exposure, that is, a relative position of the reticle R to the center of the exposure field of the projection optical system 24 (i.e., the optical axis AX). The RA reference mark is preferably a mark having a luminous property, and its image is projected on a pair of reticle alignment marks (RA marks) formed near the periphery of the reticle R via the projection optical system 24.

Though not illustrated, a wafer alignment reference mark (WA reference mark) is also provided on the reference plate 31. The WA reference mark is used to detect an offset amount (so-called base line amount) concerning an offset between the reference position of the transfer exposure and the reference position of an alignment system 33 (the center of the observation field of the alignment system 33) which will be discussed later. The reference plate 31 is provided to be at the same height as the surface of the wafer W.

A pair of reticle alignment systems (RA systems) 32 are located above the reticle R. Those RA systems 32 detect the RA marks on the reticle R and the RA reference mark on the reference plate 31 which has been projected on the RA marks. The reticle R is positioned by slightly moving the reticle stage 20 based on measurement signals from the RA systems 32 such that the center of the pattern area PA coincides with the optical axis AX of the projection optical system.

Figure 2:
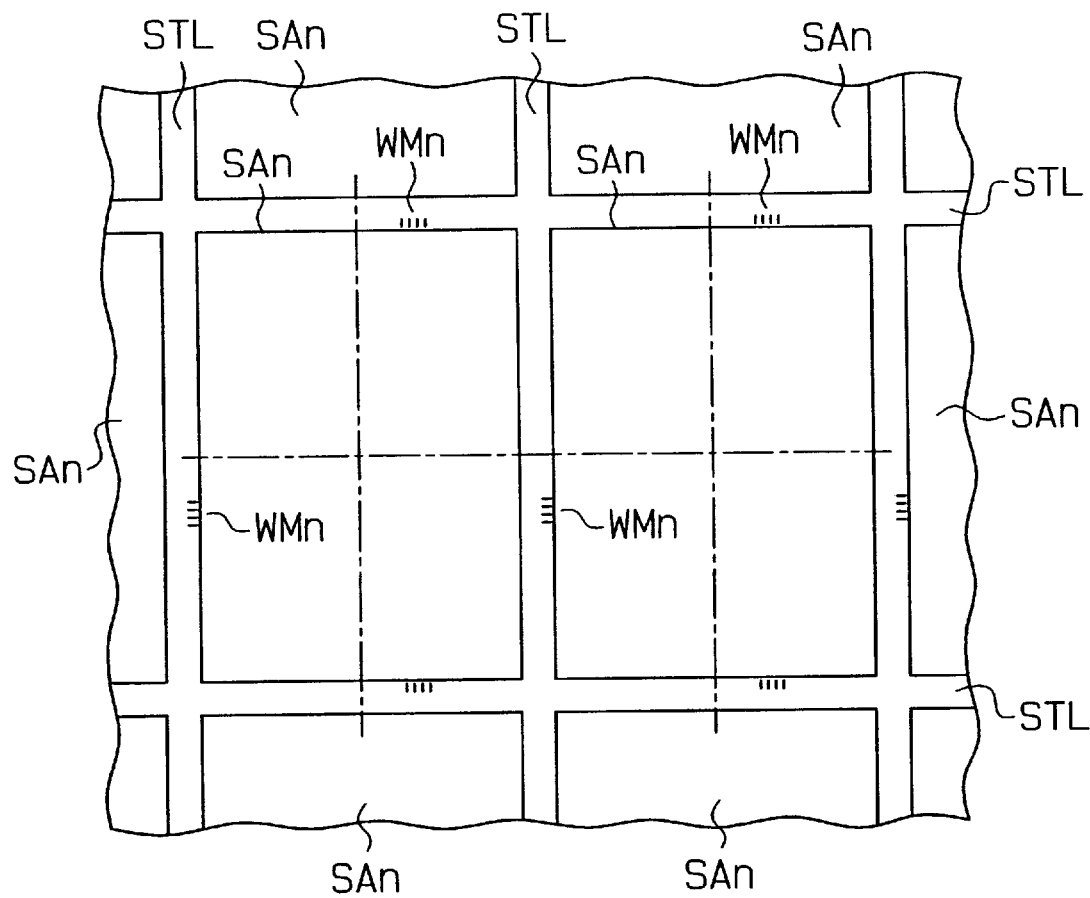
FIG. 2 is a schematic plan view showing the layout of shot areas and wafer marks on a wafer.
Figure 3:
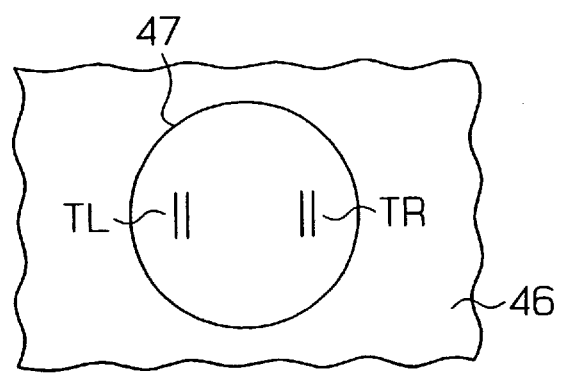
FIG. 3 is a schematic plan view of an index plate of the alignment system of the exposure apparatus in FIG. 1.
Figures 4A, 4B:
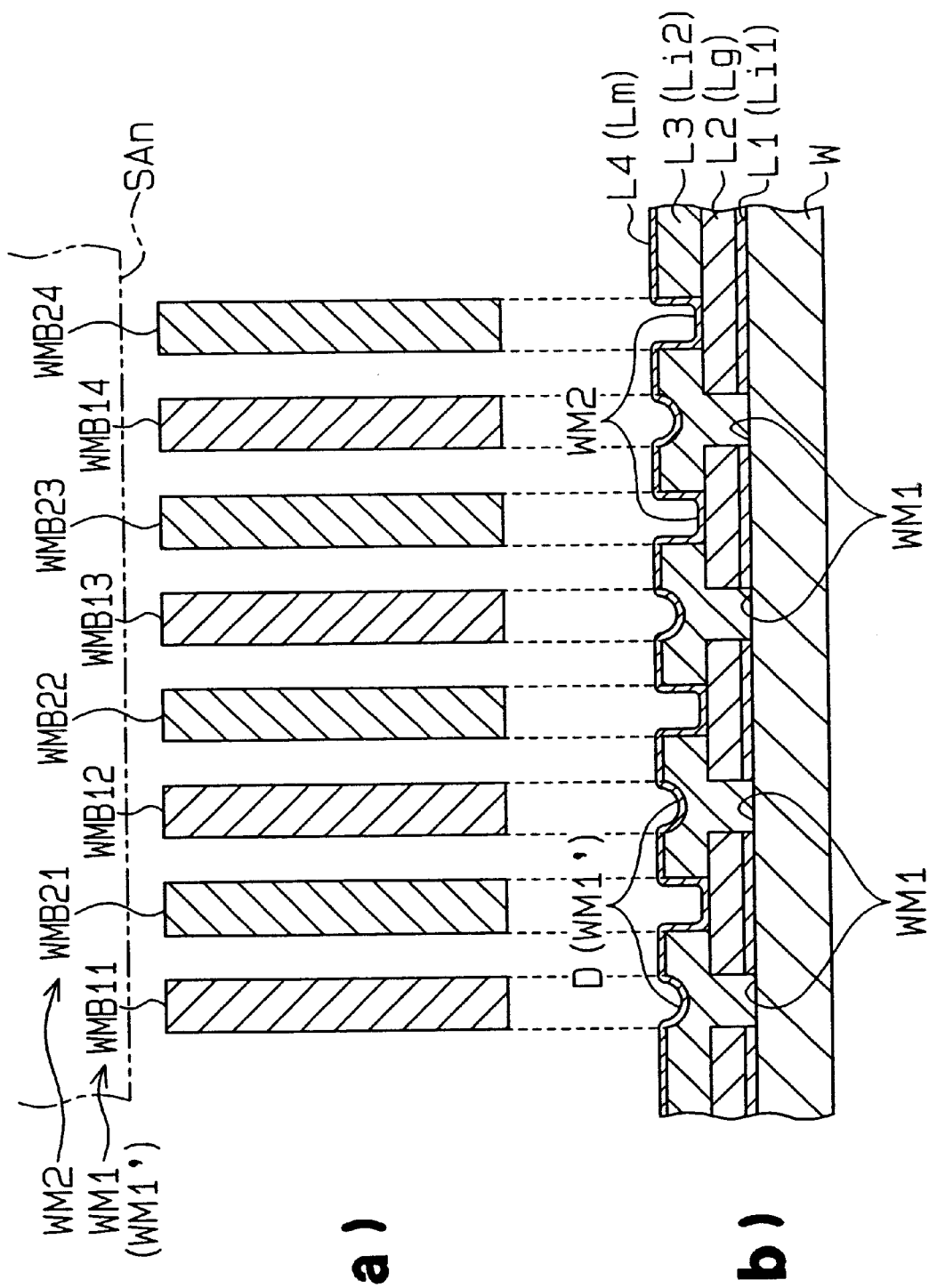
FIG. 4(*a*) is a plan view showing a combined mark including a plurality of wafer marks and FIG. 4(*b*) is a cross-sectional view of a wafer including the combined mark in FIG. 4(*a*)

A pair of reticle marks RM are formed at positions close the two sides of the pattern area PA of the reticle R. Each reticle mark RM is comprised of, for example, line and space patterns (L/S patterns) having predetermined pitches. As the reticle marks RM and the circuit pattern of the pattern area PA are projection-transferred to the photoresist layer on the wafer W, the images of the reticle marks RM are formed as latent images on the photoresist layer as shown in FIG. 2. The latent images further undergo processes, such as developing, etching, vapor phase growth and metal vapor deposition, and form street lines STL as wafer marks WMn of the individual layers around each shot area SAn as shown in FIGS. 2, 4(a) and 4(b). The wafer mark WMn is a single mark of each layer or a combined mark which has marks of a plurality of layers combined, and is used as an alignment mark pattern for alignment of each shot area SAn of the wafer W and the reticle R.

As shown in FIG. 1, the alignment system 33 of an off-axis system is preferably arranged at a side of the projection optical system 24. The alignment system 33 detects the wafer marks WMn on the wafer W and the WA reference mark on the reference plate 31. The alignment system 33 employs an image pickup system which picks up the wafer marks WMn and the WA reference mark using an image pickup device 34 as a one time detection mechanism and detects the wafer marks WMn on the wafer W and the WA reference mark (hereinafter called "FIA system (Field Image Alignment system)"). The FIA system 33 and main control system 23 constitute a mark-position detecting mechanism.

In the FIA system 33, illumination light IL of a wide range from a halogen lamp 35 enters an interference filter 38 via a condenser lens 36 and an optical fiber 37. Here, lights of the photosensitive wavelength range of the photoresist layer and the infrared ray range, which are included in the illumination light IL, are cut. The illumination light IL that has passed the interference filter 38 comes to a telecentric objective lens 43 via a lens system 39, a beam splitter 40, a mirror 41 and a field stop 42. The illumination light IL that has come out of the objective lens 43 is reflected by a prism 44 fixed to the lower peripheral portion of the lens barrel of the projection optical system 24 and illuminates the wafer W substantially perpendicularly.

An area which includes the wafer marks WMn on the wafer W is illuminated by this illumination, and reflected light RL reflected from this area according to that illumination is led to an index plate 46 via the prism 44, the objective lens 43, the field stop 42, the mirror 41, the beam splitter 40 and a lens system 45. The index plate 46 is arranged in a plane conjugate to the wafer W in association with the objective lens 43 and the lens system 45, and the images of the wafer marks WMn on the wafer W are formed in a transparent window 47 of the index plate 46 shown in FIG. 3. Formed in the transparent window 47 of the index plate 46 are index marks TR and TL at a predetermined distance. Each index mark includes two line marks extending in parallel along the Y direction.

As shown in FIG. 1, the reflected light RL that has passed the index plate 46 is guided to the image pickup device 34 via a first relay lens system 48, a mirror 49 and a second relay lens system 50. Then, as shown in FIG. 5(a), the images of the index marks TR and TL and the image of the wafer mark WMn sandwiched between the index marks TR and TL are formed on the light receiving surface of the image pickup device 34.

The image pickup device 34 is arranged such that the direction of its horizontal scan lines SCL coincides with the direction that crosses both edge portions of a plurality of mark bars WMBnm of the wafer mark WMn. The individual pixels of the image pickup device 34 store charges corresponding to the images on the light receiving surface along the N horizontal scan lines SCL under the control of the main control system 23. At this time, scattering of the illumination light IL occurs at the edge portions of each mark bar WMBnm. Therefore, the amount of light incident to the pixels corresponding to the edge portions become smaller so that the images of the edge portions are formed as dark portions. As the index marks TR and TL are illuminated with the reflected light RL at the back, the images of the index marks TR and TL are also formed as dark portions. By averaging read images of a column of pixels in the vertical direction to the horizontal scan lines SCL on the light receiving surface, the light receiving image is photoelectrically converted to an image pickup signal SV as shown in, for example, FIG. 5(b).

The image pickup signal SV has a plurality of bottom waveforms WLnm, WRnm, BLn, BRn which have minimum values at the edge positions of the individual mark bars WMBnm and the positions of the index marks TL and TR. The waveform level of each mark bar WMBnm varies according to the reflectance of the bottom of that mark bar WMBnm. The waveform level between adjacent mark bars WMBnm varies according to the reflectance of the surface of the pattern layer that is continuous to the mark bars WMBnm.

The image pickup signal SV is supplied to the main control system 23. The main control system 23 processes the image pickup signal SV for each wafer mark WMn to compute the X-axial directional position (coordinate values) of the each wafer mark WMn. Though not illustrated in FIG. 1, in addition to the FIA system (FIA system for the X axis) 33, another FIA system (FIA system for the Y axis) is provided to detect the mark position in the Y-axial direction.

The details of the wafer mark WMn will be discussed below.

First, assume that, as shown in, for example, FIGS. 4(a) and 4(b), four layers L1 to L4 are formed on the wafer W, and a predetermined pattern is transferred to the topmost fourth layer L4 (wire layer Lm). Here, the first layer L1 on the wafer W is a first interlayer insulating layer Li1, the second layer L2 is a gate electrode layer Lg of polysilicon or the like formed by chemical vapor deposition (CVD), the third layer L3 is a second interlayer insulating layer Li2 comprised of a silicon oxide film or the like formed by CVD, and the fourth layer L4 is a wire layer Lm of a conductive material, such as aluminum, indium oxide or the like, formed by vapor deposition.

Steps of forming the second and subsequent layers will be described below. Polysilicon (second layer L2) is formed on the entire surface of the wafer W by CVD, and a photoresist is applied onto this polysilicon. Next, after the circuit pattern of the gate electrode layer Lg is transfer-exposed using the first reticle R, developing, etching and resist removal are carried out. As a result, the circuit pattern of the gate electrode layer Lg is formed on each shot area SAn of the wafer W and a pair of first wafer marks WM1 are formed at predetermined positions on the street lines STL (see FIG. 2) around that circuit pattern.

Next, a silicon oxide film is grown on the entire surface of the wafer W including the gate electrode layer Lg by vapor phase using CVD. At this time, recesses D having approximately semicircular cross sections are formed on the portion of the silicon oxide film corresponding to the first wafer marks WM1. Next, a photoresist is applied onto the silicon oxide film and the circuit pattern of the second interlayer insulating layer Li2 is transfer-exposed using the second reticle R. In this case, the silicon oxide film is transparent to the illumination light IL of the FIA system 33. Therefore, the positions of the first wafer marks WM1 are detected by the FIA system 33 and the pattern area PA of the second reticle R is aligned with each shot area SAn based on the result of the detection.

After the pattern of the second interlayer insulating layer Li2 is transferred, the wafer W is subjected to developing, etching and resist removal. As a result, the circuit pattern of the second interlayer insulating layer Li2 is formed on each shot area SAn of the wafer W and a pair of second wafer marks WM2 are formed at predetermined positions on the street lines STL around that circuit pattern. Here, the alignment of the second interlayer insulating layer Li2 is carried out based on the result of the detection at the positions of the first wafer marks WM1. Accordingly, the individual mark bars WMB11–WMB14 of the first wafer marks WM1 and the individual mark bars WMB21–WMB24 of the second wafer marks WM2 are alternately laid out.

Next, a coating of a conductive material is formed on the entire surface of the wafer W including the gate electrode layer Lg and the second interlayer insulating layer Li2. Then, after a photoresist is applied onto the conductive coat, the circuit pattern of the wire layer Lm is transfer-exposed by using the third reticle R. Here, alignment is executed by using a different wafer mark WMn at the time of transferring the circuit pattern of the wire layer Lm to the conductive coat, depending on whether the conductive coat is a material transparent to the illumination light IL of the FIA system 33 (e.g., indium oxide) or a material opaque thereto (e.g., aluminum).

First, when the conductive coating is transparent, the first wafer marks WM1 formed on the gate electrode layer Lg and the second wafer marks WM2 formed on the second interlayer insulating layer Li2 are observed as a combined mark by the FIA system 33. Then, the position of the combined mark is detected by the FIA system 33. Then, position detected information of at least one of the wafer marks WM1 and WM2 is selected in accordance with the correlation between the circuit pattern of the wire layer Lm and the circuit patterns of the gate electrode layer Lg and the second interlayer insulating layer Li2. Then, the pattern area PA of the third reticle R is aligned with each shot area SAn using the selected detected information.

When the conductive coat is opaque, on the other hand, while the second wafer marks WM2 can be directly observed by the FIA system 33 via the conductive coat, it is difficult to directly observe the first wafer marks WM1. Therefore, the recesses D formed at the positions corresponding to the first wafer marks WM1 on the second interlayer insulating layer Li2 are used in place of the first wafer marks WM1. Then, the substitute first wafer marks WM1' and the second wafer marks WM2 are observed as a single combined mark by the FIA system 33. Then, position detected information of at least one of the wafer marks WM1' and WM2 is selected in accordance with the correlation between the individual circuit patterns, and alignment is performed using the selected positional information.

Here, the combined mark comprises the wafer marks WMn located on different layers Ln and the substitute wafer marks WMn' of the wafer marks WMn. The Z-axial directional positions and the cross-sectional shapes of the wafer marks WMn and WMn' and the reflectances of their reflecting surfaces differ from one another. The contrast of the light receiving image of the combined mark therefore differs for each wafer mark WMn. The signal waveform of the image pickup signal SV based on the light receiving image differs from each wafer mark WMn, WMn'. When the image pickup signal SV of the combined mark is processed directly, therefore, an error is produced due to a difference in signal waveform, thus lowering the detection precision of each wafer mark WMn, WMn'.

In contrast, the main control system 23 of the stepper of this embodiment has an automatic sensitivity adjusting (AGC: Auto Gain Control) function which corrects the sensitivity of the light receiving surface of the image pickup device 34 from the temporarily input image pickup signal SV for each bottom waveform WLnm, WRnm when the minimum value of the bottom waveform WLnm, WRnm for each wafer mark WMn differs significantly. And, the light receiving surface is rescanned while adjusting the sensitivity of the image pickup device 34 by the AGC function so that the optimal minimum value is obtained for each bottom waveform WLnm, WRnm. Accordingly, nearly equivalent bottom waveforms WLnm, WRnm are obtained.

The AGC function will be specifically explained based on FIG. 5(b). Here, the fourth layer L4 is an opaque wire layer Lm in FIG. 4.

The cross-sectional shapes and depths of the individual mark bars WMB21–WMB24 of the second wafer marks WM2 differ from those of the mark bars WMB11–WMB14 of the substitute first wafer marks WM1'. Therefore, the minimum values of the bottom waveforms WL21–WL24, WR21–WR24 of the mark bars WM21–WMB24 also differ from those of the bottom waveforms WL11–WL14, WR11–WR14 of the mark bars WMB11–WMB14. It is assumed here that the minimum values of the bottom waveforms WL21–WL24, WR21–WR24 are smaller than the minimum values of the bottom waveforms WL11–WL14, WR11–WR14. In other words, it is assumed that the a change in signal level in the vicinity of the bottom waveforms WL21–WL24, WR21–WR24 is larger than a change in signal level in the vicinity of the bottom waveforms WL11–WL14, WR11–WR14. In such a case, in acquisition of the image pickup signal SV, the sensitivity of the image pickup device 34 is corrected to be set low at the mark bars corresponding to the bottom waveforms WL21–WL24, WR21–WR24 and set high at the mark bars corresponding to the bottom waveforms WL11–WL14, WR11–WR14.

Figure 6A:
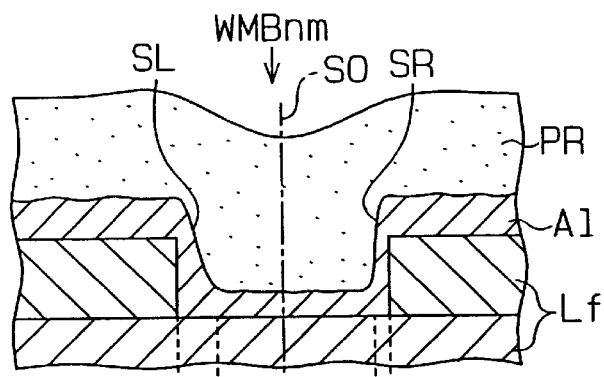
FIG. 6(*a*) is a cross-sectional view depicting a wafer mark portion.

Consider the case where the entire surface of the topmost layer on the wafer W is covered with a vapor deposition layer of aluminum. When forming a coat by vapor deposition, the thickness of the coat covering the mark bar WMBnm may become nonuniform depending on the position of the wafer mark WMn. That is, as shown in FIG. 6(a), for example, the cross-sectional shape of an aluminum coat Al which covers the mark bar WMBnm may become asymmetrical to a center separation plane S0 of the mark bar WMBnm.

Figure 6B:
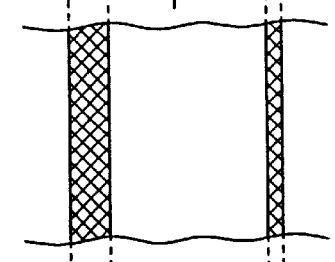
Figure 6C:
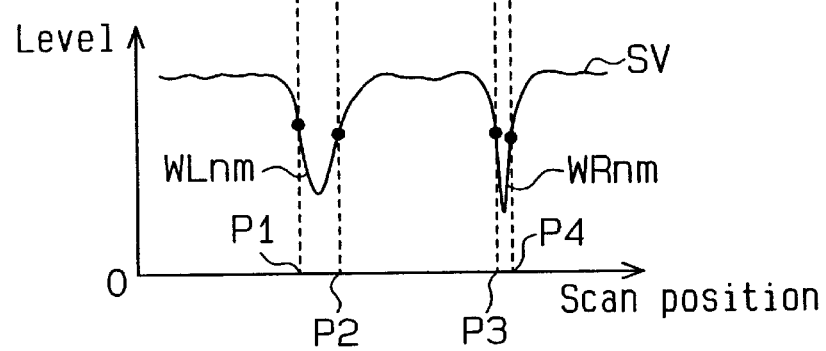

The light receiving image of such a mark bar WMBnm includes a dark portion having asymmetrical widths at both ends of that mark bar WMBnm, as shown in FIG. 6(b). As the light receiving image is read along the horizontal scan line of the image pickup device 34, therefore, the bottom waveform WLnm of the wide edge portion of one mark bar WMBnm differs considerably from the bottom waveform WRnm of the narrow edge portion, as shown in FIG. 6(c).

According to the stepper of this embodiment, by way of contrast, a method of processing the image pickup signal SV for computing positional information about each wafer mark WMn can be selected from the following three position detection modes. That is, each position detection mode as positional information computing device includes an outer-slope determining scheme, an inner-slope determining scheme and a double-slope determining scheme. The outer-slope determining scheme computes the position of each wafer mark WMn based on the outer slope portions of the bottom waveforms WLnm, WRnm of each mark bar WMBnm. The inner-slope determining scheme computes the position of each wafer mark WMn based on the inner slope portions of the bottom waveforms WLnm, WRnm. The double-slope determining scheme computes the position of each wafer mark WMn based on both inner and outer slope portions of the bottom waveforms WLnm, WRnm.

Figure 7A:
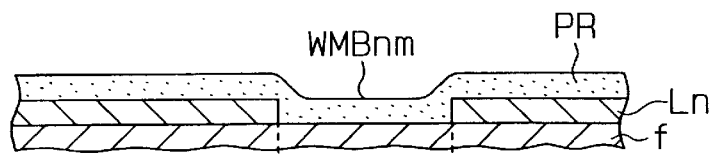
FIG. 7(*a*) is a cross-sectional view depicting a wafer mark portion.
Figure 7B:
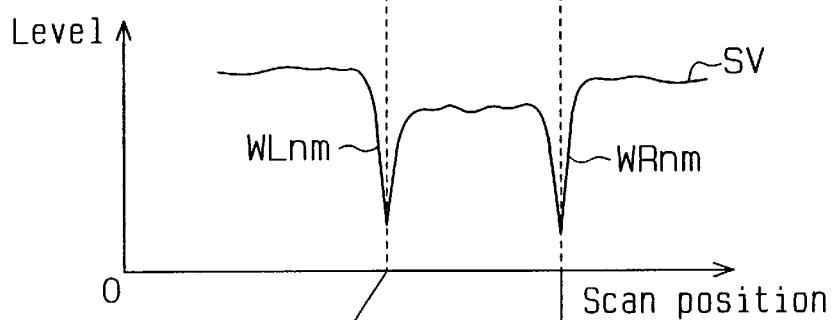

A substrate alignment method described in, for example, Japanese Unexamined Patent Publication No. 4-65603 and its corresponding U.S. Pat. No. 5,493,403 is adaptable to each slope determining scheme. The disclosures in Japanese Unexamined Patent Publication No. 4-65603 and U.S. Pat. No. 5,493,403 are incorporated herein by reference as a part of the present description. Here, the waveform processing of the most basic bottom waveforms WLnm, WRnm will be discussed according to FIGS. 7(a) to 7(c). As shown in FIGS. 7(a) and 7(b), the waveform processing of the image pickup signal SV acquired with a transparent photoresist layer PR coated on the surface of the mark bar WMBnm is taken as an example.

Figure 7C:
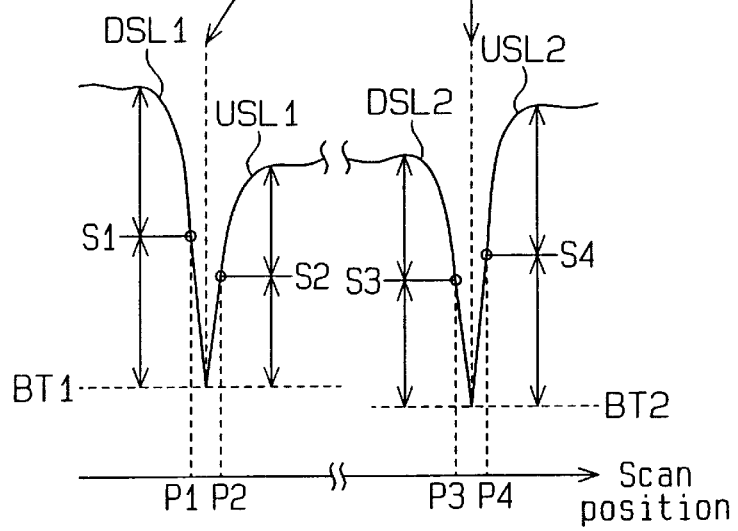

FIG. 7(c) is an enlarged diagram of two bottom waveforms WLnm, WRnm, and the bottom waveform WLnm has a down slope portion DSL1 which falls to a bottom level BT1 and an upper slope portion USL1 which rises from the bottom level BT1, both as scanning proceeds. The bottom waveform WRnm has a down slope portion DSL2 which falls to a bottom level BT2 and an upper slope portion USL2 which rises from the bottom level BT2.

First, for one bottom waveform WLnm, a slice level S1 is acquired by dividing the difference between the peak value of the shoulder portion of the down slope portion DSL1 and the bottom level BT1 by a predetermined ratio (e.g., 50%), and a scan position P1 at which the slice level S1 coincides with the slope portion DSL1 is acquired. Further, a slice level S2 is acquired by dividing the difference between the peak value of the shoulder portion of the up slope portion USL1 and the bottom level BT1 by the predetermined ratio, and a scan position P2 at which the slice level S2 coincides with the slope portion USL1 is acquired. Further, for the other bottom waveform WRnm, a scan position P3 at which a slice level S3 between the peak value of the down slope portion DSL2 and the bottom level BT2 coincides with the slope portion DSL2 is acquired. Further, a scan position P4 at which a slice level S4 between the peak value of the up slope portion USL2 and the bottom level BT2 coincides with the slope portion USL2 is acquired.

The outer-slope determining scheme determines the position of each mark bar WMBnm using the down slope portion DSL1 and the upper slope portion USL2. More specifically, the center position of each mark bar WMBnm in the scanning direction is determined by the middle point between the scan position P1 and the scan position P4. As the individual mark bars WMBnm of the individual wafer marks WMn, WMn' are arranged at the same pitch, the position of each wafer mark WMn is accurately computed from the center position of the mark bar.

The inner-slope determining scheme determines the position of each mark bar WMBnm using the upper slope portion USL1 and the down slope portion DSL2. More specifically, the center position of each mark bar WMBnm in the scanning direction is determined by the middle point between the scan position P2 and the scan position P3.

The double-slope determining scheme determines the position of each mark bar WMBnm using the down slope portions DSL1, DSL2 and the upper slope portions USL1, USL2. More specifically, the center position of each mark bar WMBnm in the scanning direction is determined by an average position of the scan positions P1 to P4. When the cross-sectional shape of each mark bar WMBnm is approximately symmetrical, the double-slope determining scheme is selected and more accurate position measuring is carried out. When the cross-sectional shape of each mark bar WMBnm is asymmetrical, on the other hand, either the outer-slope determining scheme or the inner-slope determining scheme is selected depending on the cross-sectional shape. Specifically, when each mark bar WMBnm is covered with a coat, the cross-sectional shape may become asymmetrical as shown in FIG. 6(a). In this case, either the outer-slope determining scheme or the inner-slope determining scheme is selected.

The cross-sectional shape of each mark bar WMBnm including a coat can be grasped by the method (e.g., vapor deposition) of forming the coat layer that covers that mark bar WMBnm and the layout of that mark bar WMBnm on the wafer W. That is, one of the individual slope determining schemes is selected in accordance with the coat layer of each wafer mark Wmn and the position on the wafer W and the position of that wafer mark WMn is determined.

In the example shown in FIG. 6(a), the thicknesses of surface-like portions SL, SR of an aluminum coat Al covering both wall surfaces of a layer Lf which forms the mark bar WMBnm are nonuniform. However, the shape of the shoulder portion (inclination start point) of the aluminum coat Al is nearly symmetrical. Therefore, the outer-slope determining scheme is selected at the time of detecting the mark bar WMBnm of the base layer Lf in order to form a predetermined pattern on the aluminum coat Al. The outer-slope determining scheme determines the center position of the mark bar WMBnm from the scan positions P1 and P4 as shown in FIG. 6(c). In this manner, a detection error of the center position originated from the asymmetry of the aluminum coat Al can be canceled.

The positions of the wafer marks WMn of a plurality of layers that are simultaneously detected by the image pickup device 34 of the FIA system 33 are determined. Next, positional information which corresponds to a single or a plurality of layers that are associated with a pattern to be transferred now is selected from the positional information of the individual wafer marks WMn. Then, the wafer stage 25 is moved slightly based on the selected positional information to align the reticle R with each shot area of the wafer W.

According to this embodiment, at least three, e.g, about five to ten, are selected from a plurality of shot areas SAn on the wafer W as alignment shot areas. Further, as mentioned earlier, the two sets of FIA systems detect the wafer marks WMn in the X-axial and Y-axial directions for each alignment shot area and determine the position of each wafer mark WMn, i.e., the X-axial and Y-axial directional coordinates of each alignment shot area. Then, parameters of a model function (matrix equation) that represents the layout of shot areas on the wafer W are computed based on the determined coordinate values for each alignment shot area and corresponding designed coordinate values, and the coordinate values of each shot area on the wafer W are determined by using the model function whose parameters are computed. Next, in accordance with the determined coordinate value, alignment of the reticle R with the wafer W is performed and the circuit pattern of the reticle R is transferred to each shot area on the wafer W. This is called an enhanced global alignment (EGA) system, which is disclosed in, for example, Japanese Unexamined Patent Publication No. 61-44429 and its corresponding U.S. Pat. No. 4,780,617, the disclosure of which are incorporated herein by reference.

This embodiment therefore has the following advantages.

(1) According to the stepper of this embodiment, the image pickup device 34 of the FIA system 33 simultaneously detects a plurality of wafer marks WMn and the substitute wafer marks WMn' formed on a plurality of layers Lg, Li2, Lm on the wafer W. Then, based on the detection result, the circuit pattern on the reticle R which is to be transferred next is aligned with a predetermined shot area SAn on the wafer W. At the time of transferring a new pattern associated with any of a plurality of layers Lg, Li2 onto the wafer W, therefore, it is unnecessary to individually detect the individual wafer marks WMn, WMn'. This decreases the time needed for alignment.

Unlike the prior art, it is unnecessary to move the wafer W in computing the positional information of the individual wafer marks WMn, WMn'. This does not cause a detection error originated by the movement or the like of the wafer W at the time of individually detecting the individual wafer marks WMn, WMn', making it possible to accurately acquire the positional information of the individual wafer marks WMn, WMn'. Therefore, the number of alignments at the time of transferring a new pattern associated with each layer Lg, Li2 onto the wafer W is reduced and the alignment is quickly and accurately performed. Also, a new pattern is quickly and accurately transferred, thus improving the throughput of the stepper.

(2) According to the stepper of this embodiment, the individual wafer marks WMn, WMn' are combined to fall within a predetermined reading view field of the image pickup device 34. The use of such a combined mark allows the image pickup device 34 to easily, surely and quickly perform one time detection of a plurality of wafer marks WMn, WMn'. At the time of transferring a new pattern to the wafer W, therefore, alignment is easily, accurately and quickly carried out between the circuit pattern on the reticle R and a plurality of patterns on the wafer W.

The combined mark is formed to lie within a predetermined reading view field of the image pickup device 34 (i.e., between a pair of index marks TL and TR on the index plate 46). This ensures one time detection of the individual wafer marks WMn without enlarging the image pickup device 34. Further, it is possible to avoid enlargement of the entire stepper because of the one time detection.

(3) According to the wafer manufacturing method of this embodiment, the second interlayer insulating layer Li2 is covered with the aluminum coat Al and the photoresist PR. A pattern including the reticle marks RM on the reticle R which is to be transferred is transferred to the photoresist PR first, and is then subjected to a developing process and etching process, forming the wire layer Lm. On the wire layer Lm, for example, a third interlayer insulating layer is grown by vapor phase, and the photoresist PR is applied, after which a pattern on a new reticle R is transferred. At this time, the wafer marks WMn covered with the wire layer Lm can be used as alignment marks.

(4) According to the stepper of this embodiment, the image of each of the wafer marks WMn, WMn' formed on the light receiving surface of the FIA system 33 is converted to a predetermined image pickup signal SV. This image pickup signal SV is processed for each wafer mark WMn, WMn' and positional information for each wafer mark WMn, WMn' is computed. Based on the positional information of the individual wafer marks WMn, WMn' simultaneously detected, therefore, information about the positions of the layers Lg, Li2 that are associated with the pattern to be transferred is acquired as needed.

There is a case where the optical characteristic of the surface of the coat including the individual wafer marks WMn, WMn' may differ depending on a difference between the materials of the coats of the individual layers Lg, Li2, Lm. That is, the signal levels (symmetry) of the bottom waveforms WLnm, WRnm of the individual wafer marks WMn, WMn' differ from each other in some cases. Even in such a case, it is possible to perform waveform processing suitable for the signal waveform of each wafer mark WMn, WMn', eliminate the influence of the signal waveforms of other wafer marks WMn, WMn' and accurately compute the positional information of each wafer mark WMn, WMn'.

(5) According to the stepper of this embodiment, when the bottom levels BT1 and BT2 of the bottom waveforms WLnm, WRnm of the individual wafer marks WMn, WMn' differ from each other, the sensitivity of the image pickup device 34 is adjusted for each bottom waveform WLnm, WRnm. Here, the sensitivity at the scanning time is automatically switched to scan the image of the wafer marks again so that the difference between the bottom levels BT1 and BT2 of the individual bottom waveforms WLnm, WRnm becomes smaller. This provides the image pickup signals SV of the individual wafer marks WMn, WMn' which have approximately equivalent signal waveforms based on which the positional information for each wafer mark WMn, WMn' is computed.

Even when the bottom levels BT1 and BT2 of the individual bottom waveforms WLnm, WRnm of the individual wafer marks WMn, WMn' differ from each other, the positional information of the individual wafer marks WMn, WMn' can be computed by treating the image pickup signals SV as substantially the same image pickup signal SV. It is therefore possible to precisely detect even the bottom waveforms WLnm, WRnm which have a small change in signal level, so that the positional information of the individual wafer marks WMn, WMn' can be detected accurately. Further, signal processing in computing positional information can be performed easily, thus reducing the burden on the main control system 23 which controls the signal processing.

(6) According to the stepper of this embodiment, the outer-slope determining scheme, the inner-slope determining scheme or the double-slope determining scheme is selected in accordance with the cross-sectional shapes of the individual wafer marks WMn, WMn' including the coat, and the positional information of the individual wafer marks WMn, WMn' is computed.

That is, the positional information of the individual wafer marks WMn, WMn' is computed by the optimal signal processing method according to the symmetry (shapes) of the individual bottom waveforms WLnm, WRnm of the mark bars WMBnm of the individual wafer marks WMn, WMn'. This substantially cancels a detection error in the positional information of the individual wafer marks WMn, WMn' due to the asymmetry of the individual wafer marks WMn, WMn' including the coat. It is therefore possible to improve the precision of detection of the positional information of the individual wafer marks WMn, WMn' and thus improve alignment precision.

(7) According to the stepper of this embodiment, the cross-sectional shapes of the individual wafer marks WMn, WMn' (specifically, the cross-sectional shape of the coat that covers the wafer marks) are estimated based on the materials of the layers Lg, Li2, Lm, the forming methods, and the positions of the marks WMn, WMn' on the wafer W. Based on the estimation result, the slope determining scheme is selected automatically. Therefore, it is unnecessary to select each slope determining scheme every time a new pattern is transferred to the wafer W, facilitating the exposure operation and shortening the time of processing the wafer W.

(Modifications)

This embodiment may be modified as follows.

1) This invention may be embodied in an exposure apparatus for manufacturing a display, such as a liquid crystal display device or a plasma display, which two-dimensionally links a plurality of patterns together and transfers them to a glass plate. Further, the stepper alignment method of this embodiment may be adapted to alignment of individual pattern elements in a multiple exposure process of transferring a plurality of pattern elements in an overlapping manner to a predetermined shot area SAn with respect to one layer on a wafer W.

In such link exposure and multiple exposure, every time a pattern element to be transferred is changed, a reticle R or photoresist including that pattern element should be aligned with an exposure area on a wafer W or a glass plate. That is, the number of alignments per layer increases in accordance with the number of pattern elements. The use of this invention which simultaneously detects a plurality of alignment marks therefore decreases the time needed for alignment.

2) A circuit pattern on a reticle R may be transferred in equal magnification or in enlargement, instead of being reduced and transferred, to a wafer W via the projection optical system 24. Or, the projection optical system 24 may be any of a refraction optical system comprising a plurality of refractive elements, a reflection optical system comprising a plurality of reflection elements and a reflection/refraction optical system comprising a refractive element and reflection element. This can also provide the same advantages as the advantages (1) to (7) of the embodiment.

3) This invention may be embodied into a scanning aligning type exposure apparatus which synchronously scans a reticle R and wafer W by the step and scan system, or a mirror projection aligner which projects a circuit pattern on a reticle R onto a wafer W via a reflection optical system including a plurality of reflection elements. Further, this invention may be embodied in an exposure apparatus of a step and stitch system or an exposure apparatus of a proximity system or a contact system. In the step and stitch system, either one of a static exposure method and scanning exposure method may be used at the time of transferring a pattern to each shot area. Further, this invention may be embodied into an exposure apparatus for manufacturing a thin-film magnetic head or an exposure apparatus for manufacturing an image pickup device.

Furthermore, a harmonic, which is acquired by amplifying a single-wavelength laser of an infrared range or a visible range, which is emitted from a DFB semiconductor laser or a fiber laser, by a fiber amplifier in which, for example, erbium (or both erbium and yttrium) is doped, and then subjecting it to wavelength conversion to ultraviolet light by using a non-linear optical crystal, may be used as exposure light EL. Specifically, given that the oscillation wavelength of a single-wavelength laser is set in a range of 1.51 to 1.59 $\mu$m, 8× harmonics whose generated wavelength is in a range of 189 to 199 nm, or 10× harmonics whose generated wavelength is in a range of 151 to 159 nm are output. Note that a yttrium-doped fiber laser or the like is used as a single-wavelength laser.

The exposure light EL is not limited to the vacuum ultra violet light range (wavelength of about 120 to 180 nm) and a longer wavelength range, but may be of a shorter wavelength range than the vacuum ultra violet light range, e.g., X rays or the like, or charged particle rays, such as electron rays and an ion beam. As one example, this invention may be embodied into an exposure apparatus that uses, as exposure light EL, light from a laser plasma light source or light of a soft X-ray range, for example, EUV (Extreme Ultra Violet) light having a wavelength of 13.4 nm or 11.5 nm, which is generated from SOR. Note that in the EUV exposure apparatus, a reflection type reticle (mask) is used and the projection optical system is a reduction system whose image surface side alone is telecentric, and is a reflection system which comprises only a plurality of (about 3 to 6) reflection optical elements. The electron ray exposure apparatus may be a direct writing system (including, for example, a pencil beam type, cell projection type, variable beam type, and blanking aperture array type or the like) or a projection system (for example, a system which simultaneously exposes areas each of about 250 nm on a photosensitive substrate using a transparent mask). This can also provide the same advantages as the advantages (1) to (7) of the embodiment.

4) In this embodiment, the individual mark bars WMB11–WMB14 of the first wafer marks WM1 and the individual mark bars WMB21–WMB24 of the second wafer marks WM2 are arranged alternately. The mark bars WMB11–WMB14 may be separated into a plurality of blocks and a block of the mark bars WMB21–WMB24 may be arranged between those blocks, as shown in FIGS. 8(a) and (8b). Further, the mark bars WMB21–WMB24 may be separated into a plurality of blocks and the blocks of the first wafer marks WM1 and the blocks of the second wafer marks WM2 may be arranged alternately.

Furthermore, as shown in FIGS. 8(c) and 8(d), the individual mark bars WMB11–WMB14 of the first wafer marks WM1 may be arranged consecutively and the individual mark bars WMB21–WMB24 of the second wafer marks WM2 may be arranged consecutively. This can also provide the same advantages as described in (1) to (7) of the embodiment.

5) The mark bars WMBnm of each wafer mark WMn may be one, two, three, or five or more. This can also provide the same advantages as described in (1) to (7) of the embodiment. Further, when the number of mark bars WMBnm is reduced, the wafer marks WMn and the reticle marks RM for transferring and forming the wafer marks WMn can be simplified, which is advantageous in producing the reticles R.

Furthermore, the wafer marks WMn are not limited to one-dimensional marks but may be two-dimensional marks. For example, it is possible to use a wafer mark in which two sets of mark patterns having a plurality of mark bars arranged in the X direction are provided at a predetermined distance apart and a plurality of mark bars are arranged in the Y direction between those two sets of mark patterns. In the case of using a two-dimensional mark, individual positional information in the X-axial and Y-axial directions can be acquired by one time detection by the FIA system without moving the wafer stage 25, thus making it possible to further shorten the time required for alignment. The wafer mark WMn is not limited to a cyclic mark, but may take any shape. For example, it may be a rectangular mark, so-called box mark or the like.

Figure 9:
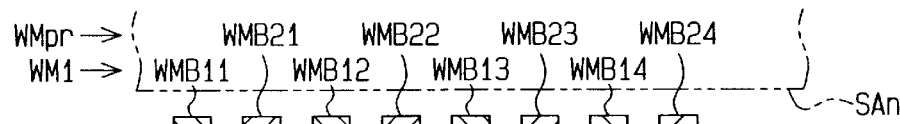
FIG. 9(a) is a plan view illustrating a third modification of a combined mark.
FIG. 9(b) is a cross-sectional view of a wafer including the combined mark in FIG. 9(a)
Figure 9:
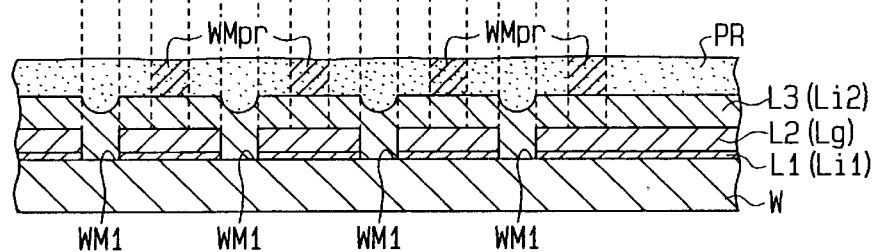

6) Although the wafer marks WMn are formed by developing or etching according to this embodiment, a latent image formed on a photoresist layer PR may be used as a wafer mark WMpr as shown in FIG. 9. In this case, as the optical characteristic of the photoresist is changed by exposure, the wafer mark WMpr still in the latent image form can be detected by the FIA system 33. This case provides such an advantage as to be particularly suitable in a multiple exposure process for a single layer on the wafer W or at the time of alignment of an exposure apparatus for a liquid crystal display, in addition to the advantages in (1) to (7) of the embodiment.

7) Although the combined mark is comprised of two wafer marks WMn in this embodiment, it may be comprised of three wafer marks WM1', WM2, WM3 as shown in, for example, FIGS. 10(a) and 10(b). Further, the combined mark may be comprised of four or more wafer marks WMn.

Figure 10:
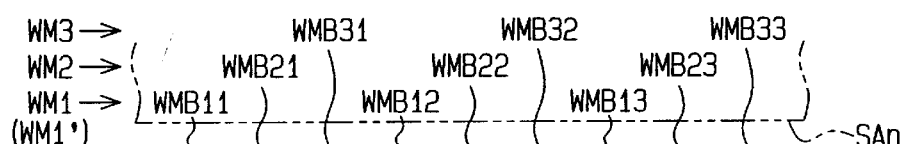
FIG. 10(a) is a plan view illustrating a fourth modification of a combined mark.
FIG. 10(b) is a cross-sectional view of a wafer including the combined mark in FIG. 10(a).
Figure 10:
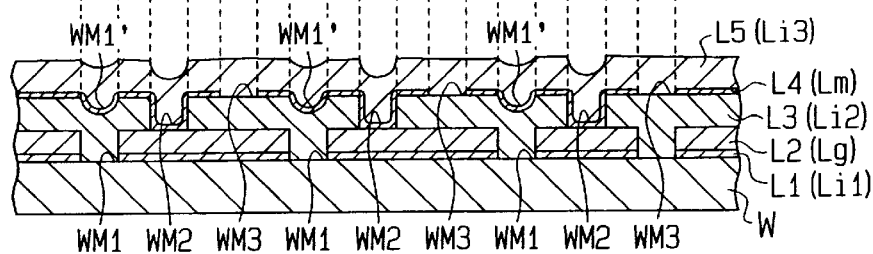

A modification shown in FIG. 10 will be explained. Third wafer marks WM3 are formed on the wire layer Lm and a fifth layer L5 (third interlayer insulating layer Li3) is grown on the entire surface of the wire layer Lm by vapor phase. Then, a predetermined pattern is transferred to the third interlayer insulating layer Li3 and patterning is carried out. At this time, the wafer marks WM1–WM3 of the individual layers Lg, Li2, Lm are simultaneously detected by the FIA system 33. When the wire layer Lm is opaque to the illumination light IL in the FIA system 33, the substitute wafer mark WM1' is used in place of the wafer mark WM1.

The positional information of the individual wafer marks WM1–WM3 are computed from the detection result and alignment is performed based on the positional information. The alignment, that is, the positional information (coordinate values) of a shot area SAn may be determined based on the positional information of the entire wafer makers WM1–WM3. Or, alignment may be carried out based on the positional information of wafer marks WMn corresponding to the layer that is associated with a pattern to be transferred next. This permits alignment of a plurality of related layers to be performed more accurately and quickly.

8) In the embodiment, the positional information of one or more wafer marks WMn, WMn' is selected based on the correlation with a circuit pattern to be transferred. Instead, the average value of the positional information of the individual wafer marks WMn, WMn' may be taken as the positional information of the wafer marks.

Further, each positional information may be weighted in determining the position of a wafer mark (shot area SAn). For example, a weight W1 may be given to the positional information of the first wafer marks WM1 and a weight W2 may be given to the positional information of the second wafer marks WM2, and then the position of the shot area SAn where a circuit pattern on the reticle R should be transferred may be determined. Here, when the weight W1 is set, for example, in the range of $0 \leq W1 \leq 1$, the weight W2 may be defined to $W2=1-W1$. It is preferable at this time to give a large weight to the layer that is associated with the pattern on the reticle R to be transferred.

This achieves accurate alignment of the pattern on the reticle R to be transferred and ensures fine adjustment of the alignment of the pattern on the reticle R with each pattern on the wafer W in accordance with the degree of relativity. Note that the method of giving weights to plural pieces of positional information and determining the positional information of the shot area SAn is disclosed in, for example, Japanese Unexamined Patent Publication No. 7-249558 and its corresponding U.S. Pat. No. 5,532,091, the disclosures of which are incorporated herein by reference.

9) In this embodiment, the position of each wafer mark WMn, WMn' is computed by selecting one of the outer-slope determining scheme, the inner-slope determining scheme and the double-slope determining scheme. But, two or more of the three slope determining schemes may be selected. In this case, it is preferable that the positional information that is computed for each selected slope determining scheme is weighted and the position of a wafer mark (shot area SAn) is then determined.

10) Only the reticle marks RM (wafer marks WMn) may be transferred to the photoresist layer PR that covers the topmost layer on the wafer W, and (the latent image of) the transferred and formed wafer mark WMn may be simultaneously detected together with the wafer mark WMn that is formed on at least one of the layers Lg, Li2, Lm. The transfer of only the reticle marks RM is accomplished using a reticle R which has only a mark pattern for alignment or by shielding the pattern area PA on the reticle R from the exposure light EL by means of the reticle blind 14. This case provides such an advantage as to be particularly suitable at the time of testing the alignment precision of the exposure apparatus and to be able to quickly and accurately measure the alignment precision, in addition to the advantages in (1) to (7) of the embodiment.

11) Although the FIA system 33 illuminates the index marks TR and TL with the reflected light RL from the wafer W, part of the illumination light IL generated from, for example, the halogen lamp 35 may be branched to illuminate the index marks TR and TL, or the index marks TR and TL may be illuminated with illumination light which is generated from a separate light source from the halogen lamp 35.

12) In the individual embodiments, at least two wafer marks formed on different layers are simultaneously detected by the FIA system and the images of the at least two wafer marks are detected with different sensitivities or the image pickup signals corresponding to the individual mark images are subjected to waveform processing by different methods. However, this invention can be adapted to the case where the FIA system detects a wafer mark WMn formed on a single layer on the wafer W. In this case, although one wafer mark WMn and the index marks TR and TL are detected by the image pickup device 34, the image pickup signals may be acquired by changing the aforementioned sensitivity between the wafer mark WMn and the index marks TR and TL, or the image pickup signals of the wafer mark WMn and the index marks TR and TL may be subjected to waveform processing by different methods (the outer-slope determining scheme, the inner-slope determining scheme and the double-slope determining scheme). That is, the detection conditions (including the aforementioned sensitivity, waveform processing, etc.) may be varied between the wafer mark WMn and the index marks TR and TL. Even when the WA reference mark on the reference plate 31, instead of the wafer mark WMn, is detected by the FIA system, the detection conditions may likewise be varied. Further, the detection conditions may be changed between the reticle mark RM and the wafer mark WMn in the alignment system of a so-called through the reticle (TTR) system, which uses the reticle marks RM in place of the index marks TR and TL or simultaneously detects the reticle marks RM and the wafer marks WMn.

13) Although the alignment system 33 employs an image processing system in each embodiment, for example, the wafer mark WMn may be a diffraction grating and a system of detecting diffracted light or the like generated from the wafer mark may be employed. This is called a grating alignment system, which is typically an LSA (Laser Step Alignment) system or LIA (Laser Interferometoric Alignment) system.

The LSA system uses wafer marks each comprising, for example, a plurality of square dots, detects scattered light or diffracted light that is generated as a predetermined laser beam is irradiated on the wafer mark, and measures the position of each wafer mark.

In the LIA system, each wafer mark is formed like a diffraction grating, two laser beams having slightly different frequencies are irradiated from two directions, the generated two diffracted lights are made to interfere with each other and the position of each wafer mark is measured from the phase. This is called a heterodyne system, and a homodyne system which does not give a frequency difference between two laser beams is known. Further known is a system which moves a wafer mark relative to a single laser beam and causes at least a pair of diffracted lights generated from that wafer mark, e.g., ± primary diffracted lights, to interfere with each other and receives them.

Although the alignment system is assumed to be an off-axis system in each embodiment, the through the reticle (TTR) system or through the lens (TTL) system may be employed instead.

In the TTR system, a combined mark comprised of the reticle mark RM formed on the reticle R and a plurality of wafer marks WMn on the wafer W is simultaneously detected by the RA system 32 and the position of each wafer mark WMn is computed based on the measurement signal from the RA system 32.

In the TTL system, a combined mark comprised of a plurality of wafer marks WMn is detected via the projection optical system 24. Those detecting methods can also provide the same advantages as the advantages (1) to (7) of each embodiment.

At least a part of the projection optical system which has a plurality of optical elements installed in the lens barrel and the illumination optical system which comprises multiple optical elements (including an optical integrator or the like) is fixed to a frame which is supported by a plurality of vibration proof pads, optical adjustments of the illumination optical system and the projection optical system are carried out, and lines and pipes are connected to the reticle state and wafer stage which comprises multiple mechanical components. Further, the lens barrel to which a plurality of optical devices constituting the FIA system are fixed is secured to the frame that supports the projection optical system and is connected to the main control system 23, and then general adjustment (electric adjustment, operational checking, etc.) is performed, thus completing the manufacture of the projection aligner shown in FIG. 1. It is desirable that the exposure apparatus be manufactured in a clean room whose temperature and degree of cleanness are controlled.

A semiconductor device is manufactured by designing the function and performance of the device, producing reticles based on the design, producing a wafer from a silicon material, transferring patterns on the reticles to the wafer by the exposure apparatus in FIG. 1, assembling the device (including a dicing step, bonding step and packaging step), inspection and so forth.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A method for detecting positional information of marks on a substrate on which a plurality of layers have been formed and for transferring a pattern formed on a mask to overlap at least one of the patterns respectively formed on the plurality of layers based on the positional information of marks, the method comprising the steps of:

simultaneously detecting a first mark formed on a first layer on the substrate and a second mark formed on a second layer different from the first layer on the substrate as a combined mark, and computing positional information of the first mark and positional information of the second mark based on signals obtained by the simultaneous detection step, and aligning the pattern on the mask with a predetermined exposure area on the substrate based on at least one of the computed information of the first mark and the computed positional information of the second mark.

2. The exposure method according to claim 1, wherein the computing step includes correcting signals of the first and second marks to signals having substantially equivalent waveforms to compute the positional information of each mark.

3. The exposure method according to claim 2, wherein the computing step includes computing the positional information of each mark by applying processing conditions different from each other to each mark.

4. An exposure method for transferring a pattern formed on a mask to a substrate, the method comprising the steps of:

simultaneously detecting a first mark formed on the substrate and a second mark formed on a second surface different from a first surface on which the first mark is formed; and correcting a signal corresponding the first mark and a signal corresponding to the second mark, which are detected by the one time detection mechanism, to signals having substantially equivalent waveforms; and computing positional information of each mark.

5. An exposure method for transferring a pattern formed on a mask to a substrate, the method comprising the steps of:

simultaneously detecting a first mark formed on the substrate and a second mark formed on a second surface different from a first surface on which the first mark is formed; and processing a signal corresponding the first mark and a signal corresponding to the second mark, which are detected by the one time detection mechanism, under processing conditions different from each other.

6. The exposure method according to claim 4 or 5, wherein the second mark is formed on the mask or an index plate provided in an optical system for simultaneous detecting.

7. The exposure method according to claim 1, 4, or 5, wherein the plurality of marks simultaneously detected by the one time detection step are marks respectively formed on different layers on the substrate.

8. The exposure method according to claim 7, further comprising the step of selecting positional information of a mark provided on a layer on which a pattern associated with a new pattern to be transferred on the substrate is formed from the positional information of the plurality of marks.

9. The exposure method according to claim 7, wherein the plurality of marks include one of a pair of a first mark formed on a first layer on the substrate and a second mark formed on a second layer formed above the first layer and a pair of the second mark formed on the second layer and a substitute mark formed on the second layer at a position corresponding to the first mark.

10. The exposure method according to claim 3 or 5, wherein the signals of the marks have first up and down slope waveforms and second up and down slope waveforms, and the processing conditions include a first processing condition that computes positional information using the first down slope waveform and the second up slope waveform, a second processing condition that computes positional information using the first up slope waveform and the second down slope waveform, and a third processing condition that computes positional information using the first down and up slope waveforms and the second up and down slope waveforms.

11. A method of manufacturing a microdevice comprising the step of transferring a device pattern formed on the mask to the substrate aligned based on the positional information of the marks computed using the exposure method according to claim 1, 4, or 5.

* * * * *